(12) United States Patent
Shumarayev et al.

(10) Patent No.: US 7,403,035 B1
(45) Date of Patent: Jul. 22, 2008

(54) LOW-POWER TRANSCEIVER ARCHITECTURES FOR PROGRAMMABLE LOGIC INTEGRATED CIRCUIT DEVICES

(75) Inventors: Sergey Shumarayev, Los Altos Hills, CA (US); Wilson Wong, San Franscisco, CA (US); Tim Tri Hoang, San Jose, CA (US); Thungoc M. Tran, San Jose, CA (US); Richard G. Cliff, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/788,561

(22) Filed: Apr. 19, 2007

(51) Int. Cl.
*H01L 25/00* (2006.01)
*H03K 19/177* (2006.01)
(52) U.S. Cl. .............................. 326/41; 326/37; 326/86
(58) Field of Classification Search .................. 326/37, 326/41, 82, 86
See application file for complete search history.

(56) References Cited

U.S. PATENT DOCUMENTS 6,617,877 B1 * 9/2003 Cory et al. ..................... 326/41
2005/0058186 A1 * 3/2005 Kryzak et al. ................ 375/219

OTHER PUBLICATIONS

U.S. Appl. No. 11/725,653, filed Mar. 19, 2007, Shumarayev et al.
U.S. Appl. No. 11/295,391, filed Dec. 5, 2005, Shumarayev et al.

* cited by examiner

*Primary Examiner*—Anh Q Tran
(74) *Attorney, Agent, or Firm*—Ropes & Gray LLP; Robert R. Jackson

(57) ABSTRACT

High-speed serial interface or transceiver circuitry on a programmable logic device integrated circuit ("PLD") includes features that permit the PLD to satisfy a wide range of possible user needs or applications. This range includes both high-performance applications and applications in which reduced power consumption by the PLD is important. In the latter case, any one or more of various features can be used to help reduce power consumption.

20 Claims, 8 Drawing Sheets

US 7,403,035 B1

LOW-POWER TRANSCEIVER ARCHITECTURES FOR PROGRAMMABLE LOGIC INTEGRATED CIRCUIT DEVICES

BACKGROUND OF THE INVENTION

This invention relates to programmable logic integrated circuit devices ("PLDs"), and more particularly to input/output (transceiver) circuitry for use on PLDs.

PLDs are typically intended to be relatively general-purpose devices. This means that a PLD product is typically designed to be able to support any of a range of uses to which various users may wish to put the device. By enabling one PLD product to satisfy such a range of possible uses, the size of the market for the product can be increased. Increased sales volume can help lower the unit cost of the product.

Giving a PLD product a range of capabilities has a tendency to increase power consumption of the PLD. This can be a significant issue for some potential users of the product. Accordingly, it can be desirable to find ways to give a PLD product a wide range of capabilities and at the same time to reduce power consumption of the PLD, especially when certain of its capabilities are not needed by users who are concerned about power consumption. The input/output (transceiver) portion of a PLD can be especially subject to considerations of this kind. This is so because there are so many different communication protocols that it may be desirable to enable a PLD product to support. Certain aspects of being able to do this may significantly contribute to PLD power consumption. But potential users who are concerned about power consumption may not need the more advanced communication capabilities of the PLD, and so it would be useful to provide a PLD transceiver architecture that can be configured for either advanced communication or reduced power operation.

SUMMARY OF THE INVENTION

In accordance with certain possible aspects of the invention, the power consumed by a PLD that includes core circuitry and high-speed serial interface ("HSSI") or transceiver circuitry can be reduced by reducing the voltage of an external power supply and an internal regulator that collectively supply power to at least some components of the high-speed serial interface circuitry. This may be possible for applications of the PLD for which reduced power consumption is important. It may limit the high-end performance attainable by the PLD, but that may be acceptable in exchange for reduced power consumption.

Another possible aspect of the invention relates to providing routing circuitry associated with one or more components of the high-speed serial interface circuitry, the routing circuitry allowing either a regulated power signal or an unregulated power signal to be applied to the associated HSSI component(s). If unregulated power is acceptable in a particular application, then it may also be possible to lower the voltage of the external source of that power (e.g., because the voltage drop of the regulator has been removed). HSSI components that sometimes need regulated power are typically analog transceiver components such as voltage-controlled oscillator circuitry, charge pump circuitry, and the like in the physical medium attachment ("PMA") portion of the HSSI circuitry.

In accordance with still other possible aspects of the invention, routing circuitry like that mentioned above may include the ability to selectively apply power from another external power supply to the HSSI component(s) associated with the routing circuitry. This other external power supply may have a voltage lower than the voltage of the external power supply associated with the above-mentioned regulator.

Other possible aspects of the invention relate to how protocol coding sublayer ("PCS") circuitry in the HSSI circuitry is used and powered. The protocol coding sublayer is provided for processing signals that are in transit between the PMA and the core (e.g., programmable logic) circuitry of the PLD. The PCS circuitry is primarily digital circuitry (in contrast to the PMA, which typically includes significant analog aspects). In accordance with the present invention, bypass circuitry can be provided for allowing the PCS to be selectively bypassed. If the bypass route is employed, signals travel more directly between the PMA and the core (i.e., without passing through the PCS). Such bypass routing can be used, for example, for applications that involve relatively low data rates. In that event, PCS power can be saved by gating off the clock signal or signals that would otherwise go to the PCS and/or by powering down the PCs.

Further features of the invention, its nature and various advantages, will be more apparent from the accompanying drawings and the following detailed description.

DETAILED DESCRIPTION

By way of further brief background, a universal, wide-range transceiver gives convenience to PLD users with respect to such considerations as selecting a system data rate and future system upgrades. However, the performance requirements of higher data rates, as supported by such a transceiver, may constitute a power burden for those users who are only interested in the lower part of the transceiver data range. For some users, power consumption may be a key issue in selecting a PLD vendor. It is therefore desirable to give power consumption an important role in the design of a PLD architecture. In addition, each successive technology node (e.g., each successive major advance in integrated circuit ("IC") fabrication technology) tends to increase the degree to which transceiver circuit components can be integrated (e.g., placed closer to one another on the PLD). This can bring system noise considerations into architectural decision-making. It is customary to integrate regulators with multiple transceiver channels to prevent noise from one channel from affecting another channel. However, such regulators bring additional power dissipation into the PLD. If competitive power analysis becomes important to a user, then the power requirements of a conventional PLD product with universal, wide-range transceivers can place that product at a disadvantage relative to another product with a more restricted data range capability. The present invention therefore aims to provide a transceiver architecture for an advanced technology node (e.g., 65 nm minimum channel length) that is capable not only of a wide programmable data rate range with built-in noise suppression techniques aimed at large, multi-channel integration, but that also has a low-power mode for low data rate communication standards (protocols) that may not require pristine jitter performance.

Figure 1:
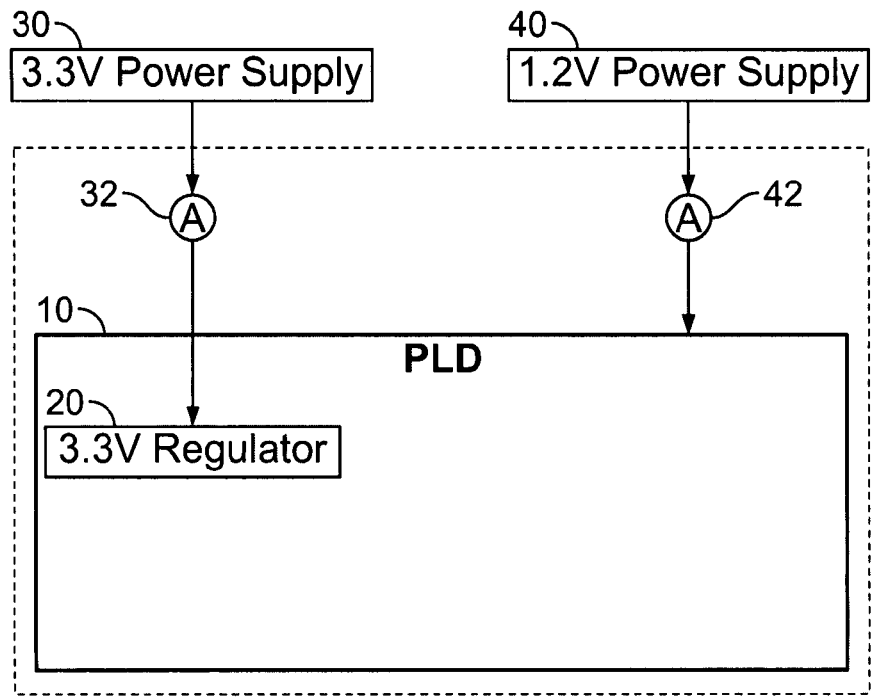
FIG. 1 is a simplified block diagram of typical circuitry that is useful in explaining certain principles of the invention.

FIG. 1 shows a power measuring method that may be used for a PLD 10 that has a built-in regulator 20. External power supply 30 supplies 3.3V power (unregulated). External power supply 40 supplies 1.2V power (unregulated). Current measuring device 32 measures the amount of current that PLD 10 draws from power supply 30. Current measuring device 42 measures the amount of current that PLD 10 draws from power supply 40.

It will be apparent from FIG. 1 that a device 10 that has an internal regulator 20 is at a disadvantage with respect to measured power consumption metrics as compared to devices that require all external regulators. This is so, for example, because any power consumed by on-board regulator 20 counts as power consumption of device 10. In accordance with certain aspects of this invention, system power can be reduced in either of the two ways that are described below.

Figure 2:
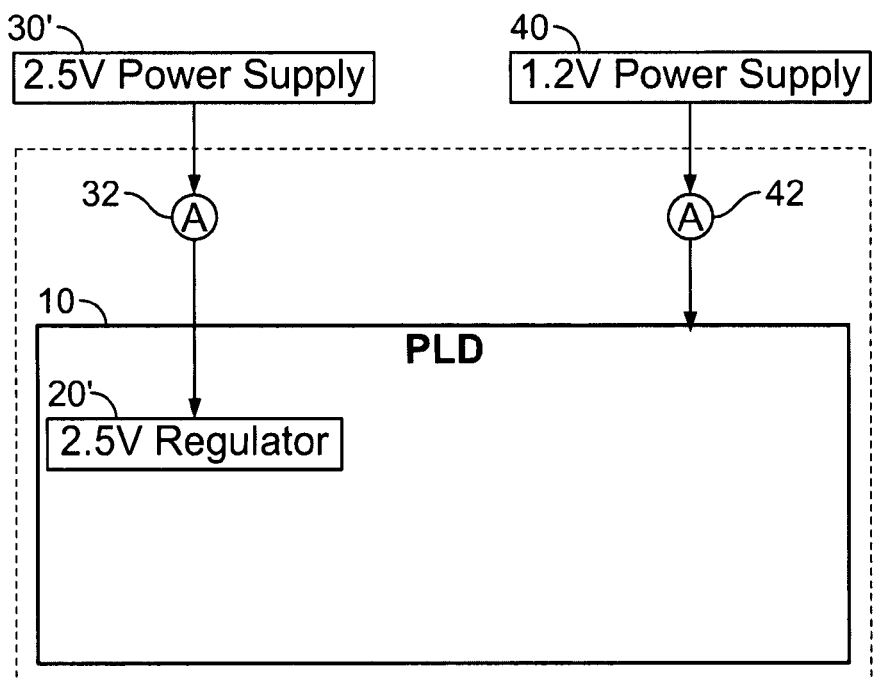
FIG. 2 shows an illustrative embodiment of an alternative to FIG. 1 in accordance with certain aspects of the invention.

One way to reduce system power is to reduce the voltage of the external supply that is required. For example, FIG. 2 shows an alternative to FIG. 1 in which 3.3V power supply 30 is reduced to 2.5V power supply 30', and in which 3.3V regulator 20 is reduced to 2.5V regulator 20'. This approach reduces the I*V (current times voltage) product by reducing the V factor in that product. As a result of such a voltage reduction, a headroom reduction will be observed in the internal regulated power supply that feeds components such as a voltage controlled oscillator ("VCO") and charge pump in transceiver circuitry that is part of PLD 10. (See FIG. 4 and associated discussion for additional information about such transceiver circuitry.) To compensate for such reduced headroom, so-called "high gear" can be used inside the VCO for low data rates. This would not normally be recommended for performance-focused designs. But it can be acceptable for low-power applications. This option will be amplified in some of the later discussion.

Figure 3:
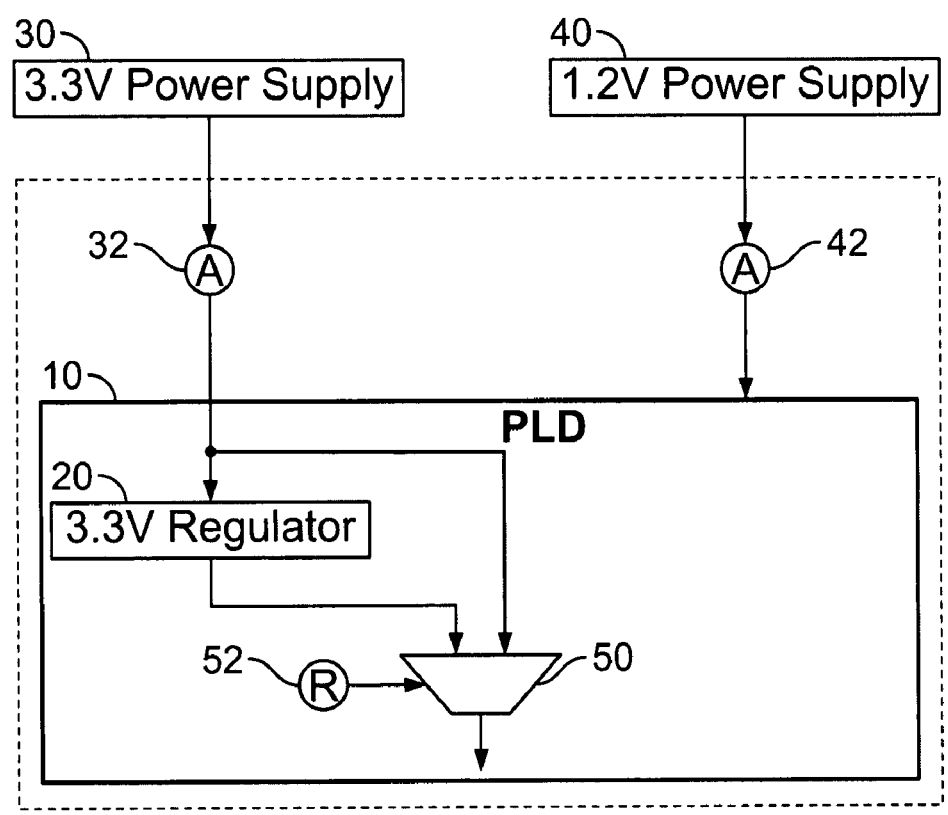
FIG. 3 shows another illustrative embodiment of an alternative to FIG. 1 in accordance with the invention.

Another possible approach to reducing system power is to equip PLD 10 with programmable regulator bypass, e.g., as shown in FIG. 3. In the FIG. 3 embodiment, power from 3.3V power supply 30 is applied to 3.3V regulator 20 on PLD 10, and also to one of the selectable (or primary) input terminals of multiplexer 50, which is also on PLD 10. The output of regulator 20 is applied to the other selectable input terminal of multiplexer ("mux") 50. Mux 50 can select either of its primary or selectable inputs as the source of its output signal. This choice or selection is controlled by the selection control input to mux 50, which selection control signal may come from configuration memory element 52, also on PLD 10. Memory element 52 is typically programmable as part of the configuration of PLD 10 to perform whatever tasks a user of the PLD wants the PLD to perform. Thus if the user's application is not especially focused on performance, but is more concerned with saving power, the user can program memory cell 52 to cause regulator 20 to be bypassed via mux 50. On the other hand, if the user's application is more concerned with performance, the user can program memory cell 52 to cause mux 50 to get its output from regulator 20 (i.e., to include regulator 20 in the circuit, rather than bypassing the regulator). When regulator 20 is bypassed, the voltage drop required to operate the regulator is removed. This reduces power consumption because the external supply 30, instead of being 3.3V, could, for example be set to 1.8V. This reduces power consumption, although it may result in increased jitter. The assumption is, however, that when power consumption is paramount, some performance issues (such as increased jitter) can be tolerated.

The use of 3.3V elements 20 and 30 in FIG. 3 is only an example, and these elements can instead have any other desired voltage value.

Figure 4:
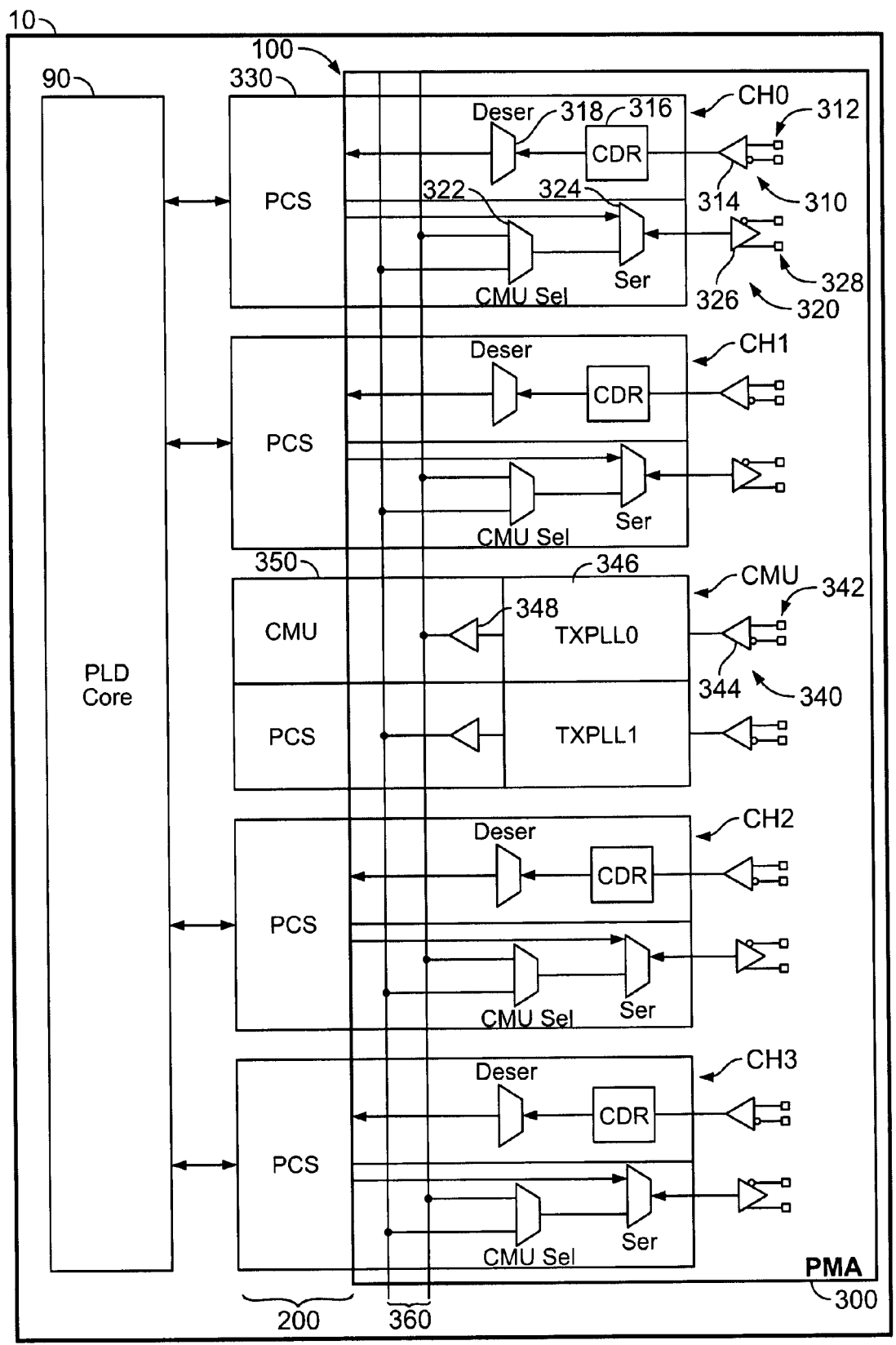
FIG. 4 is a simplified schematic block diagram of an illustrative PLD including high-speed serial interface or transceiver circuitry.
Figure 5:
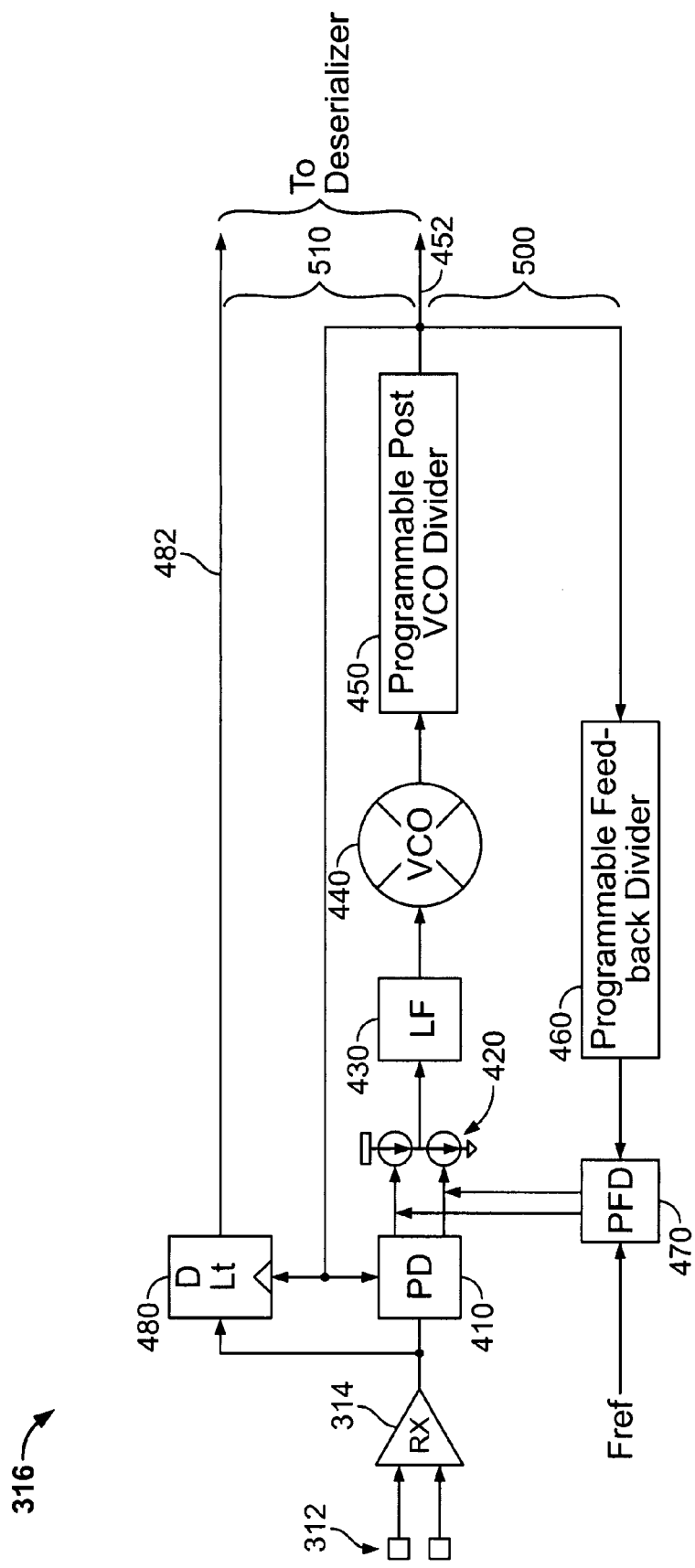
FIG. 5 is a simplified schematic block diagram of an illustrative construction of a representative portion of the FIG. 4 circuitry in somewhat more detail.

FIG. 4 illustrates PLD transceiver circuitry of a type with which various aspects of the invention may be used. FIG. 5 shows an illustrative embodiment of a representative portion of the FIG. 4 circuitry in somewhat more detail. The basics of the FIG. 4 and FIG. 5 circuitry can be conventional. Accordingly, the following description of these FIGS. can be somewhat abbreviated.

As shown in FIG. 4, PLD 10 includes PLD core circuitry 90 and transceiver circuitry 100. PLD core circuitry 90 is typically the major portion of a PLD. It includes, for example, the general-purpose, programmable logic circuitry of the PLD. Transceiver circuitry 100 may be only one representative instance of such circuitry on PLD 10. Transceiver circuitry 100 is typically used to send and/or receive one or more high-speed serial data signals.

Transceiver circuitry 100 includes two major aspects. These are protocol coding sublayer ("PCS") circuitry 200 and physical medium (or media) attachment ("PMA") circuitry 300.

The transceiver circuitry 100 shown in FIG. 4 comprises one "quad" of such circuitry. Thus circuitry 100 includes four channels of actual transceiver circuitry CH0, CH1, CH2, and CH3, and one channel of clock multiplier circuitry CMU. Each channel of transceiver circuitry CH0-CH3 includes (in PMA 300) a receiver portion 310 and a transmitter portion 320. The receiver portion 310 includes input pins 312 for receiving a differential serial data signal, input buffer circuitry 314, clock and data recovery ("CDR") circuitry 316 for recovering clock and data information from the input signal, and deserializer circuitry for converting the recovered serial data information to parallel data information. The transmitter portion 320 includes multiplexer ("mux") 322 for selecting a clock signal, serializer circuitry 324 for converting parallel data to serial form, output driver circuitry 326, and differential serial output pins 328.

The PCS portion 330 of each transceiver channel CH0-CH3 may include circuitry such as 8B/10B encoders/decoders, rate matching circuitry, word alignment circuitry, various state machines, and the like for operating on signals (typically data signals) that are in transit between the PMA and core via the PCS. PCS circuitry 330 passes parallel data in either or both directions between the associated PMA transceiver circuitry and PLD core circuitry 90. In contrast to PMA circuitry 300, which tends to include some analog signal aspects, PCS circuitry 200 tends to be entirely digital.

The CMU channel includes two subchannels of transmitter PLL circuitry (e.g., 340). Each such subchannel includes input pins 342 for receiving a differential reference clock signal, input buffer circuitry 344, phase-locked loop ("PLL") circuitry 346, output driver circuitry 348, and PCS circuitry 350. One of the functions of each CMU channel 340 is to provide a clock signal that is distributed to transceiver channels CH0-CH3 via a respective one of conductors 360. The transmitter portion 320 of each transceiver channel CH0-CH3 can select the clock signal on either of conductors 360 and thereby become synchronized with any other transmitter portion 320 that has also selected that same clock signal.

Typical construction of a representative one of transceiver channel CH0-CH3 receiver portions 310 is shown in more detail in FIG. 5. In addition to elements 312 and 314 that are repeated from FIG. 4, the elements in FIG. 5 are phase detector ("PD") 410, charge pump 420, loop filter ("LF") 430, voltage controlled oscillator ("VCO") 440, programmable post-VCO divider 450, programmable feedback divider 460, phase-frequency detector ("PFD") 470, and data latch 480. The lower loop 500 in FIG. 5, which includes elements 420, 430, 440, 450, 460, and 470 connected in that order in a closed loop series, may be referred to as a reference loop. The upper loop 510 in FIG. 5, which includes elements 410, 420, 430, 440, and 450 connected in that order in a closed loop series, may be referred to as a data loop. The output signal of element 450 may be referred to as a retimed clock signal. The output signal of element 314 is applied to a data input terminal of data latch 480. This latch is clocked by the retimed clock signal. The output signal of the data latch may be referred to as a recovered data signal.

As a whole, circuitry 316 in FIG. 5 is CDR circuitry. In other words, this circuitry is operable to recover from a high-speed serial data signal that is applied to input pins 312 both a clock signal (output on lead 452) and a serial data signal (output on lead 482). To operate in this way, circuitry 316 needs in input reference clock signal Fref, which is applied to PDF 470. Fref does not have to be phase-synchronized with the output signal of element 314, but there is typically a known relationship between the frequency of Fref and the data rate of the element 314 output signal.

Although the FIG. 5 circuitry is described above as including PLL capability, those skilled in the art will understand that this circuitry can be alternatively constructed as delay-locked loop ("DLL") circuitry. To simplify this discussion, it will be understood that references herein to PLL are generic to embodiments that are actually PLLs, and to alternative embodiments that are actually DLLs.

Returning to the use (possibly selective) of regulators as in FIGS. 1-3 in view of what has been said in connection with FIGS. 4 and 5 about the typical construction of transceiver circuitry on PLD 10, individual regulators like 20 may be used to feed sensitive analog circuitry in each transceiver channel. Examples of such sensitive circuitry include VCOs (like 440), charge pumps (like 420), PD-to-CP level shifters, and PFD-to-CP level shifters. This list is only illustrative, however, and some of these elements could be removed from the list or other elements such as phase detectors (like 410) and/or phase-frequency detectors (like 470) could be added. For example, in some PLDs only VCOs (like 440) and charge pumps (like 420) may derive power from regulators. In general, as data rate increases, it may be desirable for more circuitry to be protected by regulators. On the other hand, for very low data rate applications that do not use lots of transceiver channels, noise injections may not be critical. In such applications the improved power supply noise rejection ratio that comes from using regulators 20 may not be needed. Lower voltage power supplies can be used, and in addition, regulator circuitry (like 20) can be bypassed (e.g., as shown in FIG. 3). Under such conditions, the analog voltage level may be reduced to quite a low level (e.g., 1.2V).

Figure 6:
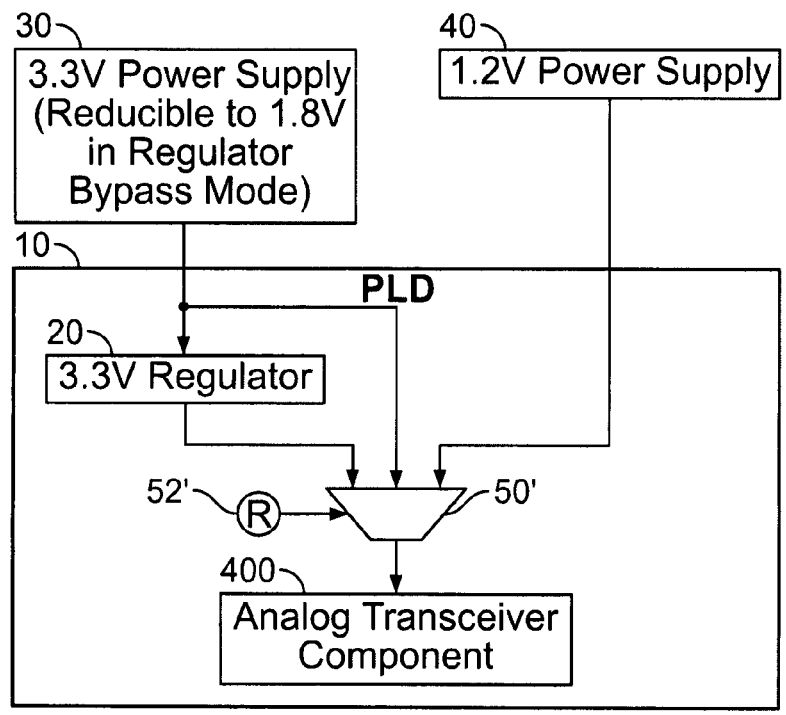
FIG. 6 is a simplified schematic block diagram somewhat like FIG. 3, but with additional components, options, and variations included.

FIG. 6 shows an illustrative embodiment which shows some of the possibilities discussed above. In FIG. 6 analog transceiver component can be any of the components identified above (e.g., a VCO 440, as just one example) as possibly needing power supply regulation by regulator 20 in high data rate applications. In such applications, power supply 30 may be a 3.3V power supply, 3.3V regulator 20 is in use, and mux 50' is programmably controlled by configuration memory element(s) 52' to connect the output signal of regulator 20 to component 400. If performance is less critical, the voltage of power supply 30 may be reduced (e.g., to 1.8V), and mux 50' may be controlled by element(s) 52' to bypass regulator 20 and apply the output signal of power supply 30 to component 400. If the application of PLD 10 is even less demanding from the standpoint of performance, component 400 may be able to operate an even lower unregulated voltage (e.g., 1.2V from power supply 40). In that event, mux 50' may be controlled by element(s) 52' to apply the output signal of power supply 40 to component 400.

Figure 7:
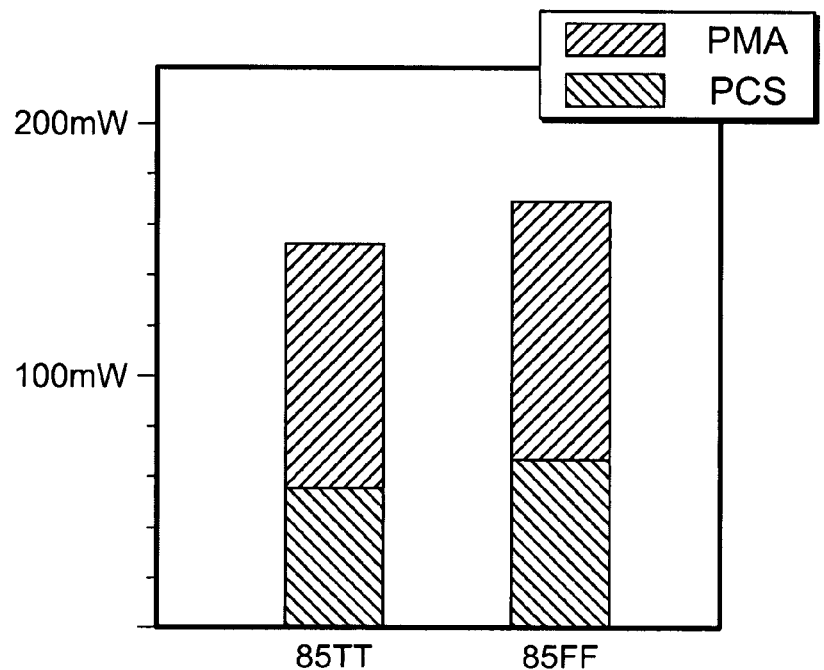
FIG. 7 is a simplified power consumption diagram that is useful in explaining certain aspects of the invention.

Another way that power consumption of PLDs of the type being discussed herein can be reduced is by managing the use of the PCS circuitry of such PLDs. FIG. 7 shows the power consumption break-down between two major sections (i.e., the PCS and PMA sections) of integrated transceivers at 3 Gbps. (85 TT refers to 85 degree C., typical NMOS and typical PMOS corner. 85 FF refers to 85 degree C., fast NMOS and fast PMOS corner.) As FIG. 7 shows, the PCS circuitry takes a significant portion of the overall power budget. PCS circuitry such as 200/330/350 in FIG. 4 is typically designed to support multiple, commonly employed communication standards or protocols, and it also typically offers significant power saving compared to implementing this digital logic in the programmable logic array (i.e., PLD core 90). However, some user applications may not use standard PCS functions. Especially for low data rate applications, PLD core performance might be well suited for small PCS functions.

In view of the foregoing, a possible aspect of the present invention is to add circuitry for allowing the PCS circuitry 200 of integrated transceivers to be selectively bypassed so that the PMA circuitry 300 can be directly connected to the PLD core 90. When such bypass routing is used, PCS power consumption can be removed from the overall transceiver power budget. This can be done, for example, by gating off the PCS clock, and/or by powering down the PCS externally. These aspects of the invention are further explained in connection with FIGS. 8-11 and in the following paragraphs.

Figure 8:
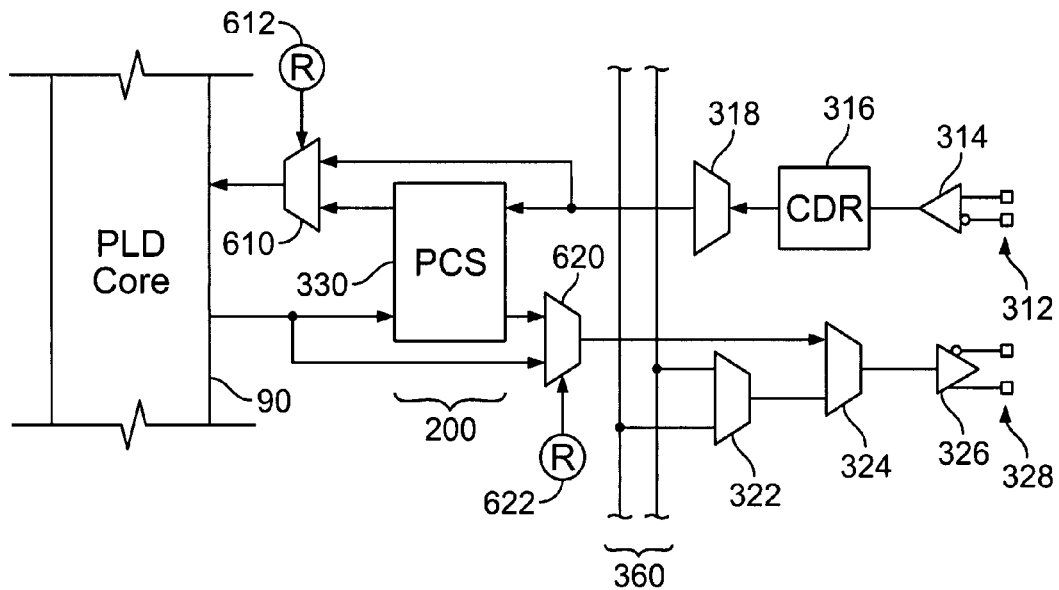
FIG. 8 is a simplified schematic block diagram similar to a portion of FIG. 4, but additionally shows an illustrative embodiment of certain possible aspects of the invention.

FIG. 8 shows an illustrative embodiment of circuitry for selectively bypassing the PCS portion 200/330 of a representative transceiver channel of the type shown in FIG. 4. On the receiver side of the transceiver channel, multiplexer ("mux") 610 is controlled (e.g., by configuration memory element 612 on the PLD) to apply either the output of deserializer 318 or the output of the receiver side of PCS 330 to PLD core 90. If processing of the output of deserializer 318 by PCS 330 is desired, then mux 610 is controlled to apply the receiver-side output of PCS 330 to PLD core 90. But if it is desired to bypass PCS 330, then mux 610 is controlled to apply the output of deserializer 318 directly to PLD core 90.

On the transmitter side of the transceiver channel, mux 620 is controlled (e.g., by configuration memory element 622 on the PLD) to apply either the output of PLD core 90 or the output of the transmitter side of PCS 330 to serializer 324. If processing of the output of PLD core 90 by PCS 330 is desired, then mux 620 is controlled to apply the transmitter-side output of PCS 330 to serializer 324. But if it is desired to bypass PCS 330, then mux 620 is controlled to apply the output of PLD core 90 directly to serializer 324.

Because it is preferable, when bypassing PCS 330, to also power down the unused PCS, the PCS-bypassing circuitry should not have muxes (like 610 and 620) and their controls inside PCS 200/330. This is so because removing power from the PCS would kill the signals that are supposed to be bypassing the PCS if the bypass muxes were in the PCS. Accordingly, bypass muxes like 610 and 620 are preferably not in PCS 200/330, but rather are outside the PCS and powered separately from the circuitry that supplies power to the PCS.

Figure 9:
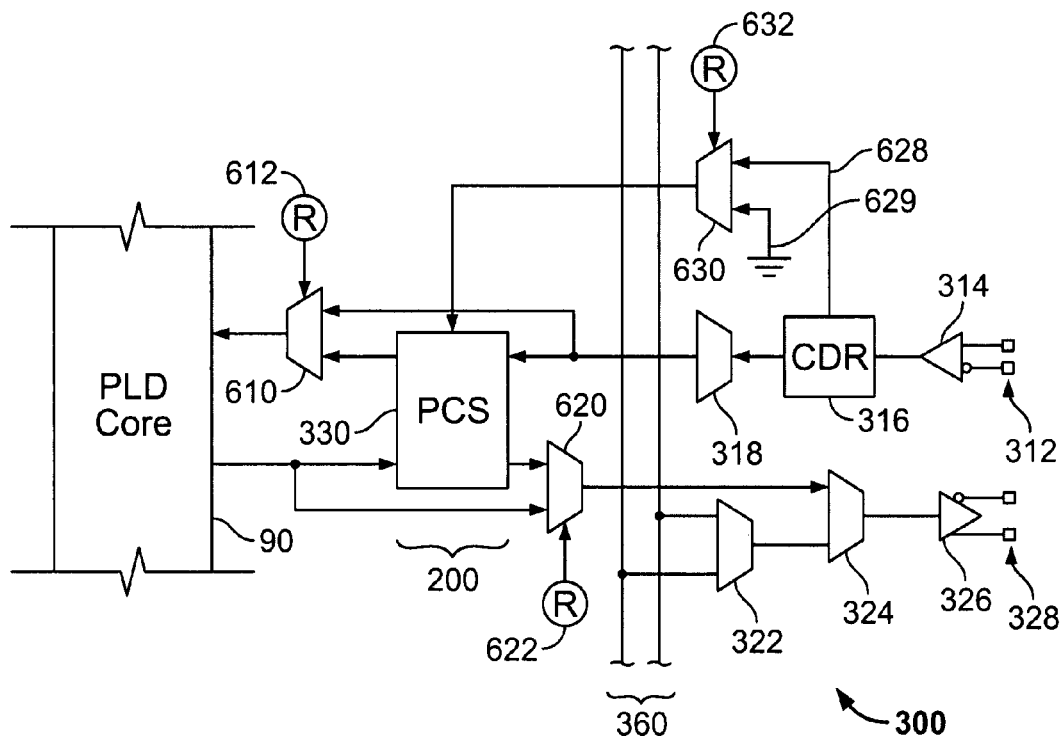
FIG. 9 is generally similar to FIG. 8, but additionally shows an illustrative embodiment of other possible aspects of the invention.

FIG. 9 shows an illustrative embodiment of how the PCS clock can be gated to reduce power when PCS 330 is being bypassed. Typically a time-varying clock signal 628 needed by PCS 330 is generated in the PMA 300. FIG. 9 shows CDR 316 as the source of clock signal 628, but it will be understood that the actual source may be other circuitry in PMA 300. For example, the clock signal recovered by CDR 316 may be subjected to frequency division by a selectable factor to produce clock signal 628. In typical prior designs this PMA-originated clock is always sent to PCS 330. Even if the PCS is not used (assuming that it is powered up), this clock is always toggling and therefore drawing switching power.

In accordance with the possible further aspect of the invention that is illustrated by FIG. 9, clock signal 628 is gated by mux 630. This mux has two selectable inputs, namely, time-varying clock signal 628 and a constant (or substantially constant) ground signal 629. Mux 630 can select either of its two selectable inputs to be its output signal, which is applied to PCS 330 for use as a clock signal within the PCS. The selection made by mux 630 may be controlled by configuration memory element 632 on the PLD. When PCS 330 is being used (e.g., not bypassed via muxes 610 and 620), mux 630 is controlled to apply clock signal 628 to the PCS. But when PCS 330 is not being used, mux 630 can be controlled to apply a constant (e.g., ground) signal to the clock input of the PCS. This avoids unnecessary clock signal toggling in PCS 330 and saves power.

Figure 12:
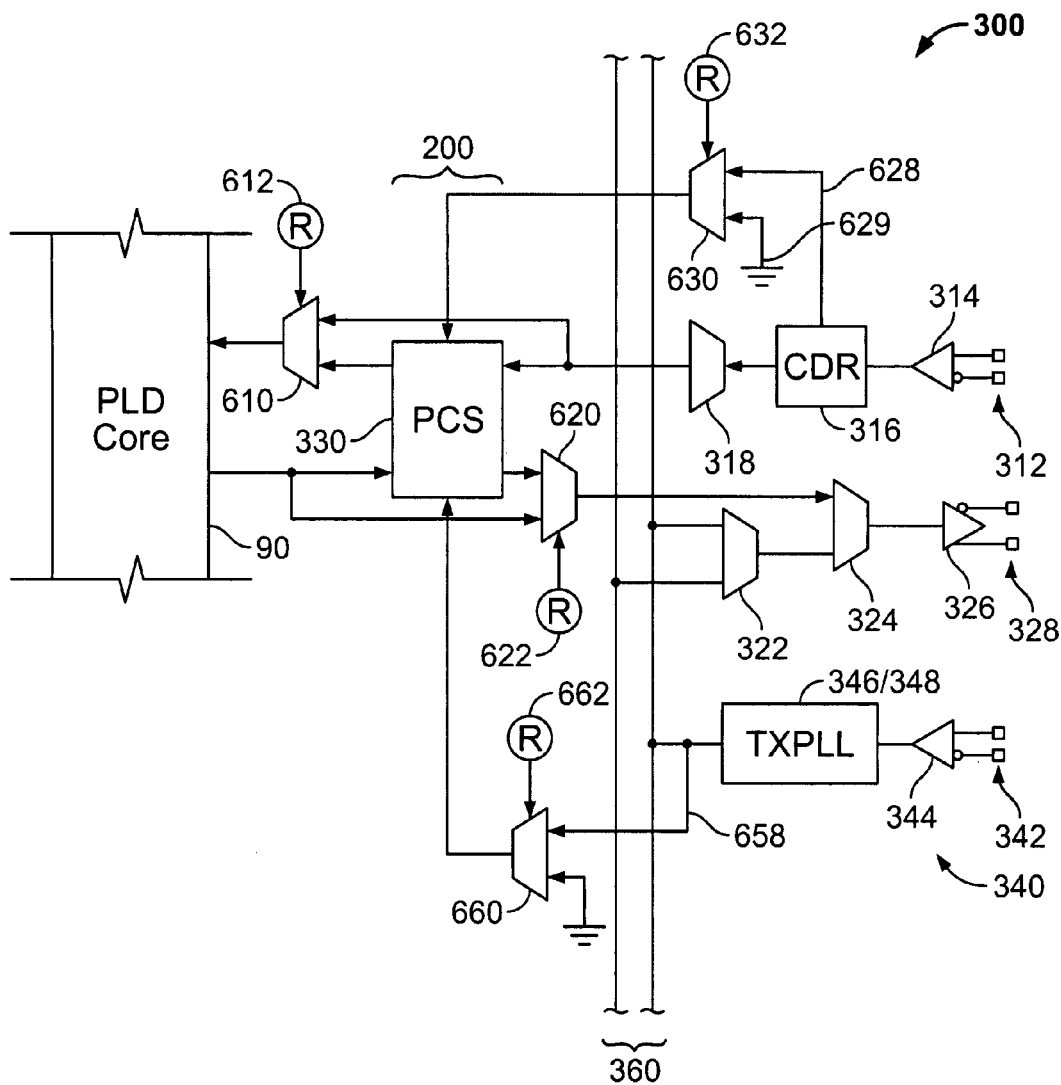
FIG. 12 is generally similar to FIG. 9, but additionally shows an illustrative embodiment of still other possible aspects of the invention.

FIG. 12 shows an illustrative embodiment of possible extension of the principle of FIG. 9 to a clock signal that may be provided for the transmit side of PCS 330. Thus FIG. 12 shows repetition (from FIG. 4) of representative TXPLL circuitry 340/342/344/346/348. A clock signal 658 output by this circuitry is selectively available to the transmit side of PCS 330 via mux 660. If PCS 330 (or at least its transmit side) is not being used, application of this clock signal to PCS 330 can be gated off by programming configuration memory element 662 to cause mux 660 to apply a ground signal (rather than clock signal 658) to the transmit side of PCS 330.

Figure 10:
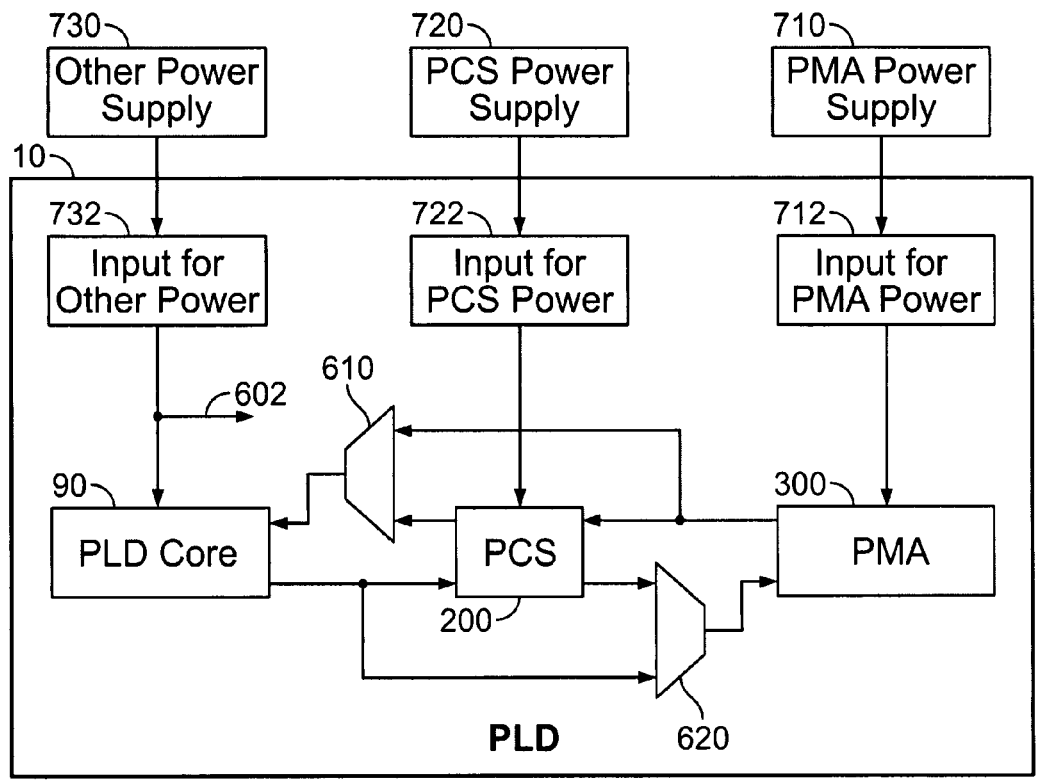
FIG. 10 is a simplified schematic block diagram of circuitry that is useful in explaining still other possible aspects of the invention.
Figure 11:
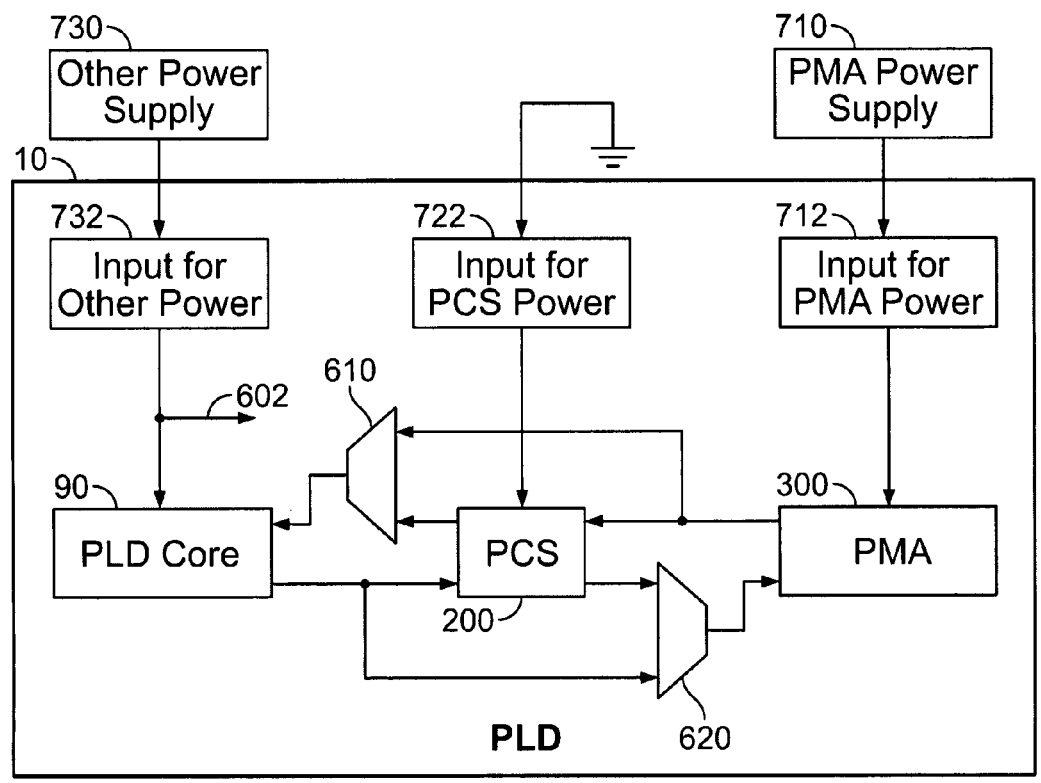
FIG. 11 shows modification of the FIG. 10 circuitry in accordance with those still other possible aspects of the invention.

FIGS. 10 and 11 illustrate the aspect of the invention that relates to possibly powering down the PCS externally. FIG. 10 shows illustrative circuitry when this is not being done (i.e., when PCS 200 is not powered down). FIG. 10 shows that PLD 10 may include (1) input circuitry 712 for receiving PMA power from external PMA power supply 710, (2) input circuitry 722 for receiving PCS power from external PCS power supply 720, and (3) input circuitry 732 for receiving power from external other power supply 730. Power is applied to PMA circuitry 300 from PMA power input 712. Power is applied to PCS circuitry 200 from PCS power input 722. Power is applied to PLD core 90 from other power input 732. FIG. 10 again makes the point (made earlier in connection with FIG. 8) that PCS bypass circuitry 610 and 620 is preferably not part of PCS 200 so that this bypass circuitry can function even if PCS 200 is powered down. For example, power required for operation of bypass circuitry such as 610 and 620 may come from a power input other than PCS power input 722. Branch lead 602 from other input 732 is an example of a source from which bypass circuitry such as 610 and 620 may get its power.

If PCS 200 is not needed for a particular user application of PLD 10, then the alternative power arrangement shown in FIG. 11 can be used instead of the FIG. 10 arrangement. FIG. 11 is basically the same as FIG. 10, except that in FIG. 11 the external connection of PCS power input 722 is to ground. Thus in FIG. 11 PCS 200 is powered down, resulting in a power saving for PLD 10. For example, this removes the leakage part of PCS power consumption. PMA 300 can still be used by bypassing PCS 200 via circuitry 610 and/or 620.

To briefly recapitulate, the various aspects of this invention make it possible for the same universal transceiver circuitry to offer flexible high-performance vs. low-power trade-offs, depending on various user requirements. A PLD 10 in accordance with this invention may be equipped for only some of the above-described aspects, or it may include all of the above-described aspects. To the extent that a PLD is equipped with these various aspects, a particular user may choose to use them in different numbers and/or in different combinations, depending on the particular application that user is implementing.

It will be understood that the foregoing is only illustrative of the principles of the invention, and that various modifications can be made by those skilled in the art without departing from the scope and spirit of the invention. For example, the particular voltages mentioned throughout this specification are only illustrative, and other voltages can be used instead if desired.

The invention claimed is:

1. A programmable logic device integrated circuit comprising:
    core circuitry; and
    high-speed serial interface circuitry, the high-speed serial interface circuitry including:
    physical medium attachment (PMA) circuitry;
    protocol coding sublayer (PCS) circuitry for processing signals in transit between the PMA circuitry and the core circuitry; and
    bypass circuitry for selectively allowing signals to pass between the PMA circuitry and the core circuitry without passing through the PCS circuitry.

2. The circuit defined in claim 1 further comprising:
    PCS power supply circuitry for supplying operating power to the PCS circuitry; and
    other power supply circuitry for supplying operating power to the bypass circuitry.

3. The circuit defined in claim 2 wherein the PCS power supply circuitry is connectable to an external source of PCS power if operation of the PCS circuitry is desired, and is alternatively connectable to a source of ground potential if operation of the PCS circuitry is not desired.

4. The circuit defined in claim 3 wherein the other power supply circuitry is connectable to another external source of power.

5. The circuit defined in claim 1 wherein the PCS circuitry includes a clock signal input, and wherein the circuit further comprises:
    circuitry for selectively applying either (1) a time-varying clock signal or (2) a substantially constant signal to the clock signal input.

6. The circuit defined in claim 5 wherein the time-varying clock signal is produced by the PMA circuitry.

7. The circuit defined in claim 1 wherein the bypass circuitry is programmably controllable.

8. The circuit defined in claim 5 wherein the circuitry for selectively applying is programmably controllable.

9. A programmable logic device integrated circuit comprising:
   core circuitry; and
   high-speed serial interface circuitry, the high-speed serial interface circuitry including:
   physical medium attachment (PMA) circuitry including a plurality of analog circuit components;
   protocol coding sublayer (PCS) circuitry for processing signals in transit between the PMA circuitry and the core circuitry;
   input circuitry for receiving a power signal from an external source;
   regulator circuitry for producing a regulated power signal from the power signal; and
   routing circuitry associated with at least one of the analog circuit components for selectively applying either the power signal or the regulated power signal to that analog circuit component.

10. The circuit defined in claim 9 wherein the routing circuitry is programmably controlled.

11. The circuit defined in claim 9 further comprising:
    programmable configuration memory circuitry for controlling the routing circuitry.

12. The circuit defined in claim 9 wherein the at least one of the analog circuit components comprises:
    voltage-controlled oscillator circuitry.

13. The circuit defined in claim 9 wherein the at least one of the analog circuit components comprises:
    charge pump circuitry.

14. The circuit defined in claim 9 wherein the at least one of the analog circuit components comprises:
    phase detector circuitry.

15. The circuit defined in claim 9 wherein the at least one of the analog circuit components comprises:
    phase-frequency detector circuitry.

16. The circuit defined in claim 9 further comprising:
    second input circuitry for receiving a second power signal from a second external source, and wherein the routing circuitry can selectively apply the second power signal to the at least one analog circuit component associated with the routing circuitry as a further alternative to applying either the power signal or the regulated power signal to that analog circuit component.

17. A programmable logic device integrated circuit comprising:
    core circuitry; and
    high-speed serial interface circuitry, the high-speed serial interface circuitry including:
    physical medium attachment (PMA) circuitry;
    protocol coding sublayer (PCS) circuitry for processing signals in transit between the PMA circuitry and the core circuitry, and having a clock signal input; and
    circuitry for selectively applying either (1) a time-varying clock signal or (2) a substantially constant signal to the clock signal input.

18. The circuit defined in claim 17 wherein the time-varying clock signal is produced by the PMA circuitry.

19. The circuit defined in claim 17 wherein the circuitry for selectively applying is programmably controllable.

20. The circuit defined in claim 17 further comprising:
    programmable configuration memory circuitry for controlling the circuitry for selectively applying.

* * * * *